Sept. 18, 1962 G. K. JENSEN ETAL 3,054,965
AUTOMATIC BANDWIDTH CONTROL WITH A.F.C.
Filed Oct. 29, 1959
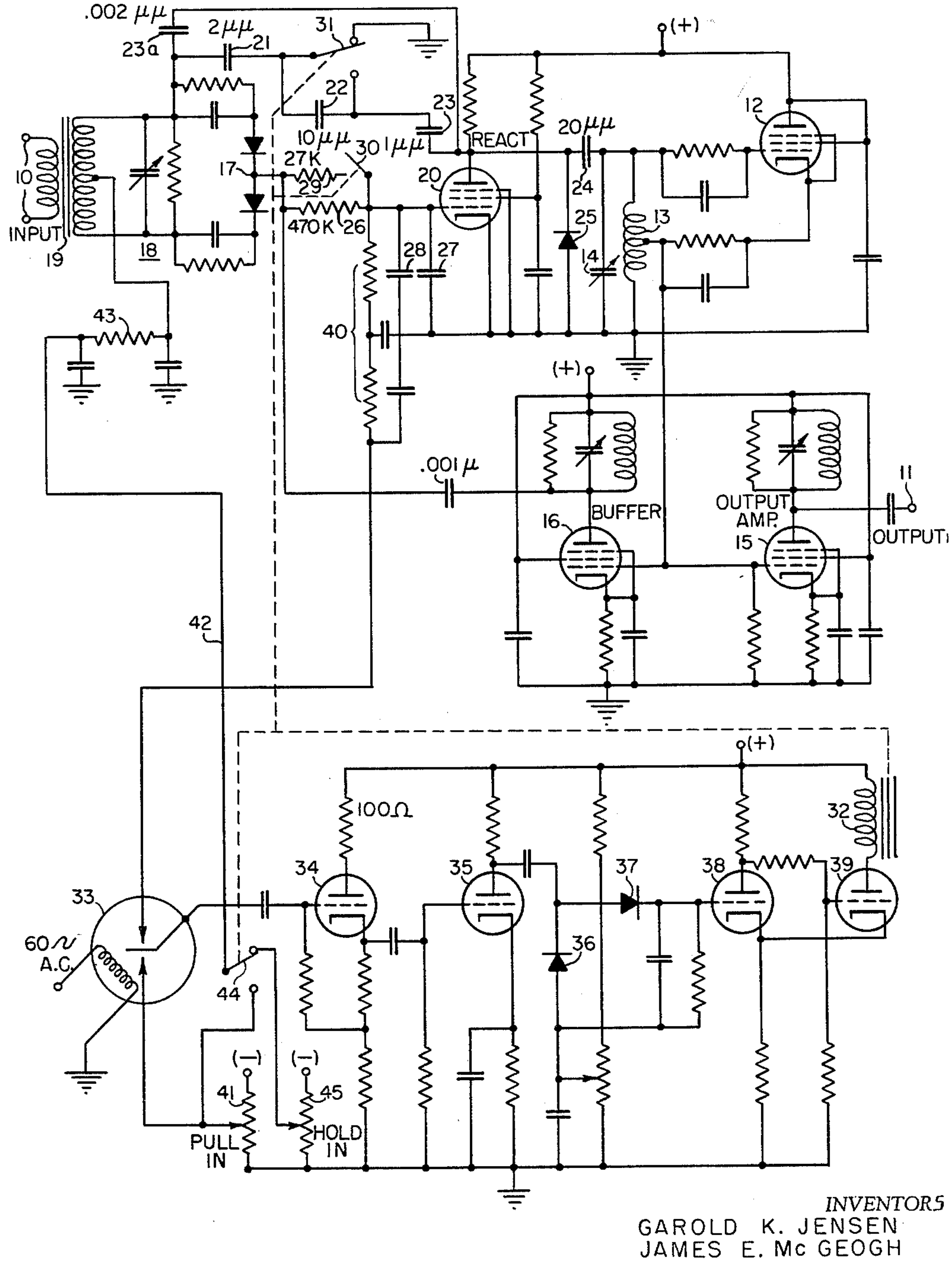
INVENTORS
GAROLD K. JENSEN
JAMES E. Mc GEOGH
BY *Richard C. Reed*
ATTORNEY

United States Patent Office 3,054,965

Patented Sept. 18, 1962

3,054,965

AUTOMATIC BANDWIDTH CONTROL WITH A.F.C.

Garold K. Jensen, Pinecrest, Va., and James E. McGeogh, Silver Spring, Md., assignors to the United States of America as represented by the Secretary of the Navy Filed Oct. 29, 1959, Ser. No. 849,695
3 Claims. (Cl. 331—17)
(Granted under Title 35, U.S. Code (1952), sec. 266)

The invention described herein may be manufactured and used by or for the Government of the United States of America for governmental purposes without the payment of any royalties thereon or therefor.

This invention relates to electrical filter circuits in general and in particular to filter circuits having an extremely narrow bandwidth and capable of selecting a desired signal which may occur at any point over an extremely wide frequency range. A typical example of the characteristics desired of the filter described herein is a filter operable in the region of ten megacycles per second, having a bandwidth of the order of a fraction of a cycle per second and capable of selecting a signal which could occur over a frequency range of 1.0 megacycle. The difficulty of meeting such extremely stringent requirements will be recognized immediately, it being obvious that even the well recognized narrow band crystal filters could not normally be capable of satisfying the foregoing requirements, particularly that of the range of operation.

It is accordingly an object of the present invention to provide an electrical filter circuit having an extremely narrow bandwidth.

Another object of the present invention is to provide an electrical filter circuit having a bandwidth of the order of a fraction of a cycle per second in the region of 10 megacycles per second center frequency.

Another object of the present invention is to provide an electrical filter circuit having a bandwidth of the order of a fraction of a cycle per second at a frequency of the order of 10 megacycles per second and which is automatically self-tuning over a wide frequency range of the order of one megacycle per second to maintain operation at the frequency of a desired incoming signal.

Other and further objects and features of the present invention will become apparent upon a careful consideration of the accompanying description and the following drawing wherein is shown a typical embodiment of the features of the present invention.

In accordance with the basic teachings of the present invention, a narrow band filter is provided employing an oscillator the output signal from which is compared with the input signals to derive a control signal which is employed to adjust the frequency of the oscillator through a variable reactance circuit to obtain correspondence between the output signal and the input desired signal. Control of the bandwidth of the filter is provided by a long time constant filter circuit disposed in the control signal portion which controls the rate at which the control signal can vary. With such a narrow bandwidth as that previously exemplified, it is apparent that there may be some difficulty in securing initial correspondence between the input and the output signal. Such is indeed the case and is avoided by several unique circuit details, one of which feeds part of the input signal directly to the oscillator to assist in the initial stabilization, following which this circuit detail is reduced greatly to remove the bandwidth widening effect that it provides and yet retain stabilization against internal hunting. A second circuit detail inserted to assist initial stabilization is a control over the time constant in the control signal path, which permits an initial higher frequency of response which is also changed as stabilization occurs. A third form of stabilization assist is provided by means of a variable biasing arrangement for the control apparatus which provides a different bias during periods when the circuit is driving to stabilization from that applied when the circuit reaches and maintains stabilization, the two being offset to assist in reaching stabilization and in returning to the driving to stabilization condition upon momentary interruption of operation.

With reference now to the drawing, the apparatus shown therein is intended to provide operation as exemplified in the foregoing, receiving input signals at input terminals 10, and providing output signals at output terminal 11. The circuit includes an oscillator having tube 12 and an LC tank circuit of inductance 13 and capacitance 14 which may be tuned to the vicinity of the desired frequency by manual operation of capacitance 14. Tube 12 is typified in a Hartley circuit having a tapped inductance with the cathode of the tube connected to the tap of the inductance. Signals existing in the oscillator circuit are delivered to an output amplifier 15 which provides isolation between the oscillator and the load connected to terminal 11, and also to a buffer amplifier 16 which likewise provides further isolation for the oscillator 12. Buffer amplifier 16 is connected to terminal 17 of a phase detector indicated in general by the numeral 18, with the signal input terminals 10 also being connected to the phase detector 18 by means of a transformer 19. Phase detector 18 is connected to a reactance control tube 20 in two ways, the first being the connection of the terminal 17 to the grid of tube 20, the other being a connection of one terminal of the input transformer 19 to the anode of tube 20 through a circuit including capacitances 21, 22, 23 and 23*a*. The reactance control tube 20 is one element of a series resistance-capacitance combination which is placed in shunt with the tuned circuit 13 and 14 to vary the effective capacitance connected thereacross and thereby provide frequency variation resulting in control over the frequency of the oscillator tube 12. Thus tube 20 is effectively a variable resistance having the resistive value thereof determined primarily by the potential of the control grid, which varies the contribution of capacitance 24 to the tuned circuit 13 and 14. In addition, a unilateral impedance element 25 is connected across tube 20 in a reverse conductivity direction wherein it becomes conductive whenever the anode potential of tube 20 falls below the cathode potential thereof to provide increased control range. This particular form of reactance control device together with the associated oscillator is described in Patent No. 2,868,979 issued to Garold K. Jensen and James E. McGeogh.

Circuitry which is important in maintaining desired operation and controlling the bandwidth of the overall system is that connected to the grid of tube 20 consisting mainly of a long time constant or integrating circuit including the basic resistance 26 and capacitances 27 and 28, one being a large capacity (40 microfarad) electrolytic unit, the other being a lower capacity unit more suitable for the bypassing of high frequencies such as a paper or a mica capacitance. Together resistance 26 and the capacitances 27 and 28 provide a circuit having a long time constant of the order of seconds to limit the rate of change of the potential of the grid of tube 20 and thereby the rate of variation of the reactance in the tuned circuit of the oscillator tube 12. As has been mentioned, this rate is so slow as to be undesirable unless close synchronization between input and output exists, and when the initial synchronization is taking place it is desirable to have a shorter time constant circuit. To this end resistance 29 is placed in the circuit in series with switch 30, the two being in shunt with resistance 26. Thus when switch 30 is closed, the opposite condition to that shown in the drawing, resistance 26 is shunted by a much smaller resistance 29 so that the time constant of the grid circuit of tube 20 is shortened.

In addition to switch 30, a second switch 31 is provided to alter the direct feed circuit of capacitances 21, 22 and 23 in such a manner that it is effective only when the circuit is in the fast response condition approaching synchronization in which condition switch 31 is in the lower position of the drawing providing a circuit from the phase detector 18 to the tuned circuit 13 and 14 via capacitances 21 and 23 in series, capacitance 22 being shorted by switch 31. Capacitance 22 is provided to maintain substantially constant the loading upon the oscillator circuit regardless of the position of switch 31. In addition a second direct feed circuit of capacitance 23–*a* is provided remaining in the circuit at all times. This capacitance is selected to provide a balance between when the capacitance is too large the bandwidth widening due to direct noise fed through and bandwidth widening due to internal hunting when the capacitance is too small. In practice this capacitance may have the typical value of .002 micro-microfarad however, if desired it may be increased in size above this minute amount by tapping down on the secondary of transformer 19. In any event, care must be exercised to determine by trial and error which side of the transformer 19 provides the proper polarity direct feed signal to obtain the desired result. When the circuit is in the stabilized condition, switch 31 moves to the upper position as shown in the drawing at which state the junction between capacitances 21 and 22 is grounded preventing further delivery of direct signals from the transformer of the phase detector 18 to the tuned circuit 13 and 14 via capacitances 21 and 23.

Control of the switches 30 and 31 is provided by a D.C. amplifier circuit which operates relay coil 32 to produce motion of the movable contacts of switches 30 and 31. These switches are indicated in the drawing in the energized condition of relay coil 32, the switches 30 and 31 being in the opposite conditions when relay 32 is not energized. The D.C. amplifier circuit which operates relay 32 consists of a chopper 33, a cathode follower impedance isolation device 34, amplifier 35, voltage doubling rectifier of unilateral impedance devices 36, 37 and a Schmidt trigger circuit of tubes 38, 39 with the coil of relay 32 disposed in the anode circuit of tube 39.

Chopper 33, which may typically operate at a frequency of 60 cycles per second by virtue of a connection of the internal actuation means thereof to a 60 cycle A.C. supply, alternately connects the grid of tube 34 to the grid of tube 20 via a filter circuit 40, and to a source of reference potential, the tap of potentiometer 41. When the potential at the grid of tube 20 approaches the reference source of potentiometer 41, there is substantially no signal delivered through the tubes 34, 35 so that the grid of tube 38 is at a low potential. With this condition existent, the Schmidt trigger circuit is in a stable state wherein tube 39 is conductive, resulting in energization of relay coil 32 and operation of the switches 30 and 31 to the position shown in the drawing. When the potential at the grid of tube 20 differs significantly from that of the reference as obtained from potentiometer 41, a substantial signal is delivered through tubes 34 and 35, rectified by unilateral impedance devices 36, 37 resulting in the delivery of an elevated potential to the grid of tube 38 causing the Schmidt trigger circuit to be in a stable condition with tube 39 nonconductive, relay coil 32 not energized and relay switches 30 and 31 thus operated to the opposite position from that shown in the figure. Normally this is the condition which would exist when the apparatus is first turned on or when some interruption such as momentary loss of the input signal to terminals 10 or the like occurs. In this condition the phase detector 18 will cause a self stabilization action of the circuit with the circuit correcting itself to where the potential at the grid of tube 20 rapidly approaches that of the reference from potentiometer 41 so that the circuit eventually approaches the stabilized condition.

Since some mid-range D.C. biasing of tube 20 is desired, it is preferred that it be obtained through some means other than requiring unbalancing of the phase detector 18. To this end it is obtained by means of a bias line indicated in general by the numeral 42 which is connected to the center tap of input transformer 19 via a filter circuit 43. This circuit is connected through relay operated switch 44 to the reference potentiometer 41 when switch 44 is in the downward position, such as would exist during the pull-in condition. Relay 32 also operates switch 44, switch 44 being indicated in the drawing in the condition corresponding to that of the other switches 30 and 31 which is the normal operative condition after stabilization has occurred. In the condition in which stabilization is taking place however, switch 44 is in the lower position resulting in the connection of the line 42 to the reference potentiometer 41. When relay 32 is energized, switch 44 moves to the upper position connecting line 42 to bias potentiometer 45. It has been found that a separate bias source for the "hold-in" condition is more desirable than that maintained in the "pull-in" period, for example, to provide a slight offset to cause operation of relay 32 upon loss of signal. Normally this bias potential would be adjusted in such a way that the potential at the grid of tube 20 is substantially equal to that of the reference bias control 41 during stabilized operation so that there is a very insignificant signal applied to the D.C. amplifier input tube 34 during the chopping operation of the chopper 33 which continues in all conditions of the relay 32. This is of no particular effect when the phase detector is operative with an input signal however it is enough to cause energization of relay 32 upon loss of signal input.

In operation of the circuit, an initial condition may be assumed wherein an input signal is being supplied to terminals 10 but this signal differs greatly from that of the oscillator 12. In this condition therefore the phase detector 18 delivers a substantial output signal which provides the grid of tube 20 with a potential which is substantially different from that maintained on the reference potentiometer 41 and applied through line 42 so that a substantial signal is applied through tubes 34 and 35 to the Schmidt trigger circuit resulting in tube 39 being cut off and relay 32 deenergized. As a result of this condition of relay 32, the switches 30, 31 and 44 are in the deactivated condition which is opposite to that indicated in the drawing. Thus a portion of the signal existing at the secondary of transformer 19 is coupled directly to the tuned circuit 13 and 14 via capacitances 21 and 23 to assist in the stabilization, the short time constant resistor 29 is in the circuit to bypass the long time constant resistor 26, and the reference potential is applied to line 42. This overall condition prevails with the phase detector 18 providing an output potential which drives the grid of tube 20 to alter the frequency of operation of the oscillator 12 in such sense that it is brought into agreement with the input signal applied at terminals 10. As this condition of agreement is approached, the magnitude of the chopped signal supplied to the grid of tube 34 diminishes, until finally a condition is reached at which the Schmidt trigger circuit of tubes 38 and 39 moves to the other stable condition wherein tube 39 is conductive with the relay 32 energized. At this instant the switches 30, 31 and 44 move to the position indicated in the drawing, the result being that the direct application of input signal to the tuned circuit 13 and 14 is reduced, the long time constant resistor 26 is no longer bypassed by the short time constant resistor 29, and the line 42 is switched to the bias potentiometer 45. The circuit is then in the stabilized condition capable of following input signal frequency variations which do not exceed the permissible rate of variation as determined by the time constant circuit in the grid of tube 20. If a change occurs which exceeds this bandwidth, the chopped signal supplied to the grid of tube 34 becomes sufficiently large to automatically throw the circuit into the pull-in condition in which rapid readjustment to a stabilized condition can again occur.

It is thus seen that the overall circuit provides an output signal at one basic frequency, such a signal being variable at the rate determined by the time constant circuit at the grid of tube 20 which thus provides in effect a limitation upon the bandwidth of the output. In addition the circuit provides a narrow-band filter effect, is self-tuning, and retunes itself if it loses lock.

Obviously, many modifications and variations of the present invention are possible in the light of the above teachings. It is therefore to be understood that within the scope of the appended claims the invention may be practiced otherwise than as specifically described.

What is claimed is:

1. A filter for producing a narrow band output signal from an input signal of variable frequency, comprising, an oscillator, a variable reactance circuit connected to said oscillator whereby the oscillator frequency can be varied over the frequency range of the input signal, means for comparing the input signal with the output signal and producing a control signal in dependency on any difference therebetween, means for applying said control signal to the variable reactance circuit to control the frequency of the oscillator whereby the output signal frequency is maintained in correspondence with the input signal frequency, said last named means containing a low pass filter for limiting the rate of variation of the control signal as utilized by the variable reactance circuit and thereby limiting the rate of change of the output signal frequency, and means for applying a greater portion of the input signal to the oscillator when there is a large difference between input and output frequency.

2. A filter for producing a narrow band output signal from an input signal of variable frequency, comprising, an oscillator, a variable reactance circuit connected to said oscillator whereby the oscillator frequency can be varied over the frequency range of the input signal, means for comparing the input signal with the output signal and producing a control signal in dependency on any difference therebetween, a control circuit for applying said control signal to the variable reactance circuit to control the frequency of the oscillator whereby the output signal frequency is maintained in correspondence with the input signal frequency, said control circuit containing a low pass filter for limiting the rate of variation of the control signal as utilized by the variable reactance circuit and thereby limiting the rate of change of the output signal frequency, means for developing a bias signal for the control circuit, and means for changing the bias signal of the control circuit to provide a different bias when there is a large difference between input frequency and output frequency than when the two frequencies are substantially identical.

3. A filter for producing a narrow band output signal from an input signal of variable frequency, comprising, an oscillator, a variable reactance circuit connected to said oscillator whereby the oscillator frequency can be varied over the frequency range of the input signal, means for comparing the input signal with the output signal and producing a control signal in dependency on any difference therebetween, a control circuit for applying said control signal to the variable reactance circuit to control the frequency of the oscillator whereby the output signal frequency is maintained in correspondence with the input signal frequency, said control circuit containing a low pass filter for limiting the rate of variation of the control signal as utilized by the variable reactance circuit and thereby limiting the rate of change of the output signal frequency, means for integrating the control signal, means for applying a portion of the input signal to the oscillator, means for biasing the control circuit, and means for controlling said last three means whereby in the two conditions, namely, when there is a large difference between input frequency and output frequency and when there is substantial correspondence therebetween, the means for integrating has a different time constant, the amount of input signal applied to the oscillator is different, and the bias on the control circuit is different.

References Cited in the file of this patent

UNITED STATES PATENTS

| | | |
|---|---|---|
| 2,801,336 | Neetson | July 30, 1957 |
| 2,828,419 | Gruen | Mar. 25, 1958 |

FOREIGN PATENTS

| | | |
|---|---|---|
| 637,380 | Great Britain | May 17, 1950 |
| 1,201,550 | France | July 15, 1959 |